(12) United States Patent
Yang et al.

(10) Patent No.: US 12,733,538 B2
(45) Date of Patent: Sep. 8, 2026

(54) DIE STACKING STRUCTURE, SEMICONDUCTOR PACKAGE AND MANUFACTURING METHOD OF THE DIE STACKING STRUCTURE

(71) Applicant: Taiwan Semiconductor Manufacturing Company, Ltd., Hsinchu (TW)

(72) Inventors: Su-Chun Yang, Hsinchu County (TW); Jih-Churng Twu, Hsinchu County (TW); Jiung Wu, Taoyuan City (TW); Chih-Hang Tung, Hsinchu (TW); Chen-Hua Yu, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 643 days.

(21) Appl. No.: 17/738,032

(22) Filed: May 6, 2022

(65) Prior Publication Data

US 2023/0360993 A1 Nov. 9, 2023

(51) Int. Cl.

| | |
|---|---|
| ***H10W 74/10*** | (2026.01) |
| ***H10W 74/01*** | (2026.01) |
| ***H10W 74/43*** | (2026.01) |
| ***H10W 90/00*** | (2026.01) |
| *H10W 70/60* | (2026.01) |
| *H10W 70/685* | (2026.01) |
| *H10W 74/00* | (2026.01) |
| *H10W 74/15* | (2026.01) |

(Continued)

(52) U.S. Cl.
CPC ....... *H10W 74/147* (2026.01); *H10W 74/016* (2026.01); *H10W 74/43* (2026.01); *H10W 90/00* (2026.01); *H10W 70/60* (2026.01); *H10W 70/685* (2026.01); *H10W 74/00* (2026.01); *H10W 74/10* (2026.01); *H10W 74/127* (2026.01); *H10W 74/15* (2026.01); *H10W 74/40* (2026.01); *H10W 80/312* (2026.01); *H10W 80/327* (2026.01); *H10W 90/401* (2026.01); *H10W 90/701* (2026.01); *H10W 90/722* (2026.01); *H10W 90/724* (2026.01); *H10W 90/734* (2026.01); *H10W 90/754* (2026.01); *H10W 90/792* (2026.01)

(58) Field of Classification Search
CPC .. H01L 21/563; H10W 74/147; H10W 90/401
See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |
| 9,299,649 | B2 | 3/2016 | Chiu et al. |

(Continued)

*Primary Examiner* — Eric K Ashbahian
(74) *Attorney, Agent, or Firm* — JCIPRNET

(57) ABSTRACT

A die stacking structure, a semiconductor package and a method for manufacturing the die stacking structure are provided. The die stacking structure includes a first device die; second device dies, bonded onto the first device die, and arranged side-by-side; a gap profile modifier, laterally enclosing bottommost portions of the second device dies, wherein a thickness of the gap profile modifier gradually decreases away from sidewalls of the second device dies; and a dielectric material, covering the gap profile modifier and laterally surrounding the second device dies.

20 Claims, 13 Drawing Sheets

(51) Int. Cl.
*H10W 74/40* (2026.01)
*H10W 80/00* (2026.01)

(56) References Cited

U.S. PATENT DOCUMENTS

| | | | | |
|---|---|---|---|---|
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 2002/0149097 | A1* | 10/2002 | Lee | H01L 25/0652 257/676 |
| 2013/0009319 | A1* | 1/2013 | Shao | H01L 21/565 425/395 |
| 2015/0348915 | A1* | 12/2015 | Maillard | H01L 21/563 257/659 |
| 2021/0066155 | A1* | 3/2021 | Nofen | H01L 21/02288 |
| 2021/0066254 | A1* | 3/2021 | Yu | H01L 23/13 |
| 2022/0068839 | A1* | 3/2022 | Ke | H10W 42/121 |

* cited by examiner

DIE STACKING STRUCTURE, SEMICONDUCTOR PACKAGE AND MANUFACTURING METHOD OF THE DIE STACKING STRUCTURE

BACKGROUND

In recent years, semiconductor industry has strived to continually reduce feature size and power consumption of various electronic components, while on the other hand increasing device density, wire density and operation frequency of the electronic components. These advanced electronic components also require smaller packages that utilize less area than packages of the past.

Three dimensional integrated circuit (3DIC) is a recent development in semiconductor packaging in which multiple semiconductor dies are stacked upon one another. 3DIC provides improved integration density and other advantages, such as greater operation speed and higher bandwidth, because of the decreased length of interconnects between the stacked dies. However, there are quite a few challenges to be overcome for the technology of 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
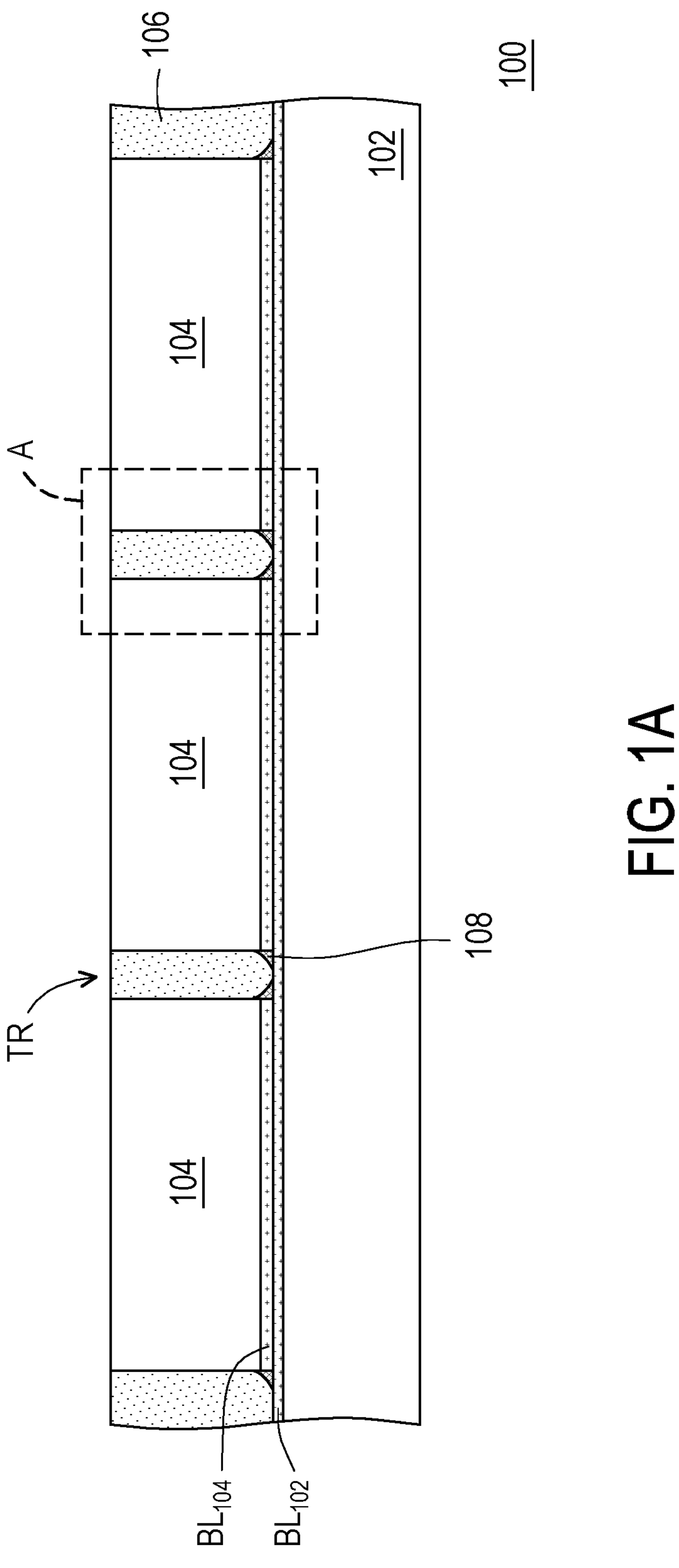
FIG. 1A is a schematic cross-sectional view illustrating a package structure, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

FIG. 1A is a schematic cross-sectional view illustrating a package structure 100, according to some embodiments of the present disclosure.

Referring to FIG. 1A, the package structure 100 includes a device wafer 102 and multiple device dies 104 bonded to the device wafer 102. Although not shown, the device wafer 102 may include active devices built on a semiconductor substrate, and may include a stack of metallization layers over the semiconductor substrate for out routing and interconnecting the active devices. A side of the semiconductor substrate at which the active devices and the metallization layers are formed is referred to a front side of the device wafer 102. On the other hand, the other side of the semiconductor substrate facing away from the active devices and the metallization layers is referred to a back side of the device wafer 102. According to some embodiments, the device dies 104 are bonded to the front side of the device wafer 102. In alternative embodiments, the device dies 104 are bonded to the back side of the device wafer 102.

In some embodiments, the device wafer 102 further includes a bonding layer $BL_{102}$ on which the device dies 104 are bonded. In those embodiments where the device dies 104 are bonded to the front side of the device wafer 102, the bonding layer $BL_{102}$ is disposed at the front side of the device wafer 102. On the other hand, in those embodiments where the device dies 104 are bonded to the back side of the device wafer 102, the bonding layer $BL_{102}$ is disposed at the back side of the device wafer 102. Although not shown, the bonding layer $BL_{102}$ may include conductive features for establishing electrical contact with the device dies 104, and may include an insulating layer laterally surrounding the conductive features. For instance, the conductive features may be conductive pads.

In those embodiments where the device dies 104 are bonded to the back side of the device wafer 102, the device wafer 102 may further include through substrate vias (not shown). The through substrate vias extend into the device wafer 102 from a back surface of the semiconductor substrate of the device wafer 102, to be electrically connected with the active devices and the metallization layers formed at the front side of the device wafer 102. In other words, the through substrate vias provide conduction paths bridging between the front and back sides of the device wafer 102.

The device dies 104 may be singulated from other device wafer(s), and may be identical with or different from one another, in terms of size and types of the integrated circuits formed therein. As similar to the device wafer 102, each device die 104 may include active devices built on a semiconductor substrate, and may include a stack of metallization layers formed over the semiconductor substrate. A side of the semiconductor substrate at which the active devices and the metallization layers are formed is referred to a front side of the device die 104. On the other hand, the other side of the semiconductor substrate facing away from the active devices and the metallization layers is referred to a back side of the device die 104. According to some embodiments, each device die 104 is bonded to the device wafer 102 by its front side. In alternative embodiments, each device die 104 is bonded to the device wafer 102 by its back side.

Further, as similar to the device wafer 102, each device die 104 may further include a bonding layer $BL_{104}$ configured to engage with the device wafer 102. In those embodiments where the device dies 104 are bonded to the device wafer 102 by their front sides, the bonding layers $BL_{104}$ are respectively disposed at the front side of one of the device dies 104. On the other hand, in those embodiments where the device dies 104 are bonded to the device wafer 102 by their back sides, the bonding layers $BL_{104}$ are respectively disposed at the back side of one of the device dies 104. Although not shown, the bonding layer $BL_{104}$ may include conductive features for establishing electrical contact with the device wafer 102, and may include an insulating layer laterally surrounding the conductive features. For instance, the conductive features may be conductive pads.

Moreover, in those embodiments where the device dies 104 are bonded to the device wafer 102 by their back sides, each of the device dies 104 may further include through substrate vias (not shown). The through substrate vias extend into the device die 104 from a back surface of the semiconductor substrate of the device die 104, to be electrically connected with the active devices and the metallization layers formed at the front side of the device die 104. In other words, the through substrate vias in each device die 104 can provide conduction paths bridging between the front and back sides of the device die 104.

In some embodiments, the device dies 104 are bonded to the device wafer 102 by a hybrid bonding manner. In these embodiments, the conductive features in the bonding layers $BL_{104}$ of the device dies 104 are respectively bonded to one of the conductive features in the bonding layer $BL_{102}$ of the device wafer 102. Further, the insulating layers of the bonding layers $BL_{104}$ are bonded to the insulating layer of the bonding layer $BL_{102}$. At least one thermal treatment may be used for establish bonding between the conductive features and between the insulating layers.

The device dies 104 bonded to the device wafer 102 are laterally spaced apart from one another. A dielectric material 106 fills up spacing between the device dies 104, and laterally encapsulates each of the device dies 104, so as to protect the device dies from moisture absorption, corrosion, electrical noise or the like. In some embodiments, the dielectric material 106 on the device wafer 102 is formed to a height substantially identical with a thickness of the device dies 104. In these embodiments, a top surface of the dielectric material 106 may be substantially coplanar with surfaces of the device dies 104 facing away from the device wafer 102. In addition, according to some embodiments, the dielectric material 106 is a silicon oxide based dielectric material. For instance, the silicon based dielectric material may include tetraethoxysilane (TEOS). In these embodiments, the dielectric material 106 may be formed by a deposition process, such as a chemical vapor deposition (CVD) process. According to alternative embodiments, the dielectric material 106 is formed of a molding compound with a polymer matrix and optional fillers spreading in the polymer matrix, and a proper molding process may be selected for forming the dielectric material 106.

Quality of the dielectric material 106 is affected by geometry of the trenches TR extending between the device dies 104. For instance, when an aspect ratio of the trenches TR increases and bottom corners of the trenches TR are less rounded, seams and voids may be more often found in the dielectric material 106, and an ability of the dielectric material 106 to protect the device dies 104 may be compromised. The aspect ratio of the trenches TR increases as a thickness of the device dies 104 increases. Generally, the thickness of the device dies 104 may be equal to or greater than about 10 μm. In more advanced technology generations, the thickness of the device dies 104 may increase to about 100 μm. In order to ensure quality of the dielectric material 106 formed in such high aspect ratio spacing, gap profile modification patterns 108 are used to re-shape geometry of the trenches TR. In some embodiments, the gap profile modification patterns 108 laterally surround a bottom portion of each of the device dies 104, and may respectively have a slant or concave surface defining bottom corners of the re-shaped trenches TR. As a result, the re-shaped trenches TR have more rounded bottom corners, thus the dielectric material 106 filled in the re-shaped trenches TR can have a more promising quality. The gap profile modification patterns 108 are formed of a dielectric material. According to some embodiments, the gap profile modification patterns 108 are formed of spin-on-glass (SOG). In these embodiments, as will be further described in details, a method for forming the gap profile modification patterns 108 may include a spin coating process and a following baking process. According to alternative embodiments, the gap profile modification patterns 108 are formed of a polymer material, such as polyimide, polybenzoxazole (PBO), benzocyclobutene (BCB) or the like. In these alternative embodiments, a method for forming the gap profile modification patterns 108 may include a spin coating process as well, and may further include a curing process.

Figure 1B:
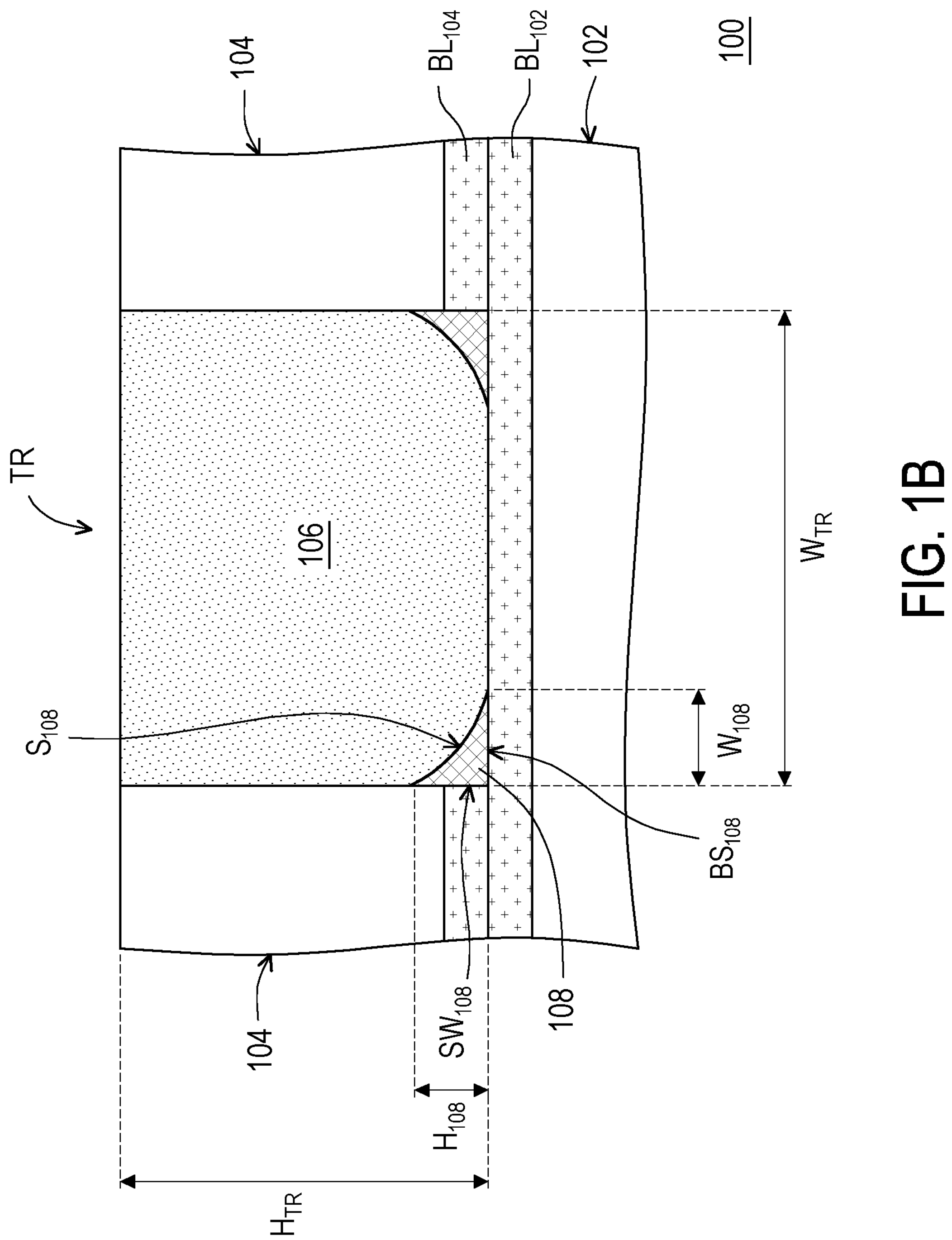
FIG. 1B is an enlarged schematic cross-sectional view illustrating a region A shown in FIG. 1A.

FIG. 1B is an enlarged schematic cross-sectional view illustrating a region A shown in FIG. 1A.

Referring to FIG. 1A and FIG. 1B, in some embodiments, each gap profile modification pattern 108 is formed as a sidewall spacer positioned at a bottom corner of the trench TR between adjacent device dies 104. The gap profile modification pattern 108 has a bottom surface $BS_{108}$ in contact with the underlying device wafer 102, and has a sidewall $SW_{108}$ in lateral contact with a bottom portion of the surrounded device die 104. In addition, the gap profile modification pattern 108 has a slant or concave surface $S_{108}$ extending between a top end of the sidewall $SW_{108}$ and a far end of the bottom surface $BS_{108}$ away from the surrounded device die 104. The surfaces $S_{108}$ of the gap profile modification patterns 108 are in contact with the dielectric material 106 from below, and re-define bottom corners of the trenches TR extending among the device dies 104. These re-defined bottom corners of the trenches TR are more rounded (as compared to the bottom corners of the trenches TR without being re-defined by the gap profile modification patterns 108), thus the dielectric material 106 can be formed with less defects.

According to some embodiments, a width $W_{TR}$ of the trench TR between adjacent device dies 104 ranges from about 10 μm to about 100 μm. In these embodiments, the bottom surface $BS_{108}$ of the gap profile modification pattern 108 in the trench TR extends from a sidewall of the surrounded device die 104, to a width $W_{108}$ that may range from about 1 μm to about 10 μm. Accordingly, the gap profile modification patterns 108 positioned at the two bottom corners of the trench TR between adjacent device dies 104 may be laterally spaced apart from each other, and the dielectric material 106 covering the gap profile modification patterns 108 can be in contact with the device wafer 102 without the gap profile modification patterns 108 in between.

In addition, in some embodiments, a height $H_{TR}$ of the trench TR between adjacent device dies 104 ranges from about 10 μm to about 100 μm. In these embodiments, the gap profile modification patterns 108 extends from a top surface of the device wafer 102 to a height $H_{108}$ that may range from about 1 μm to about 10 μm. In other words, the gap profile modification patterns 108 may not climb to top ends of the sidewalls of the device dies 104. Instead, the gap profile modification patterns 108 are limited to the bottom corners of the trenches TR, and top ends of the gap profile modification patterns 108 may be vertically spaced apart from the top ends of the sidewalls of the device dies 104. In addition, upper portions of the device dies 104 may be in lateral contact with the dielectric material 106 without the gap profile modification patterns 108 in between.

In some embodiments, as shown in FIG. 1B, the top ends of the gap profile modification patterns 108 are substantially leveled with top ends of the bonding layers $BL_{104}$ of the device dies 104. However, the top ends of the gap profile modification patterns 108 may be alternatively lower or higher than the top ends of the bonding layers $BL_{104}$. The height $H_{108}$ of the gap profile modification patterns 108 can be adjusted according to a process selected for forming the gap profile modification patterns 108 as well as an amount of the material used in the selected process for forming the gap profile modification patterns 108. Similarly, the width $W_{108}$ of the gap profile modification patterns 108 can be modified according to the selected formation process and the amount of the material used for the selected formation process. The present disclosure is not limited to the height $H_{108}$ and the width $W_{108}$ of the gap profile modification patterns 108.

Figure 1C:
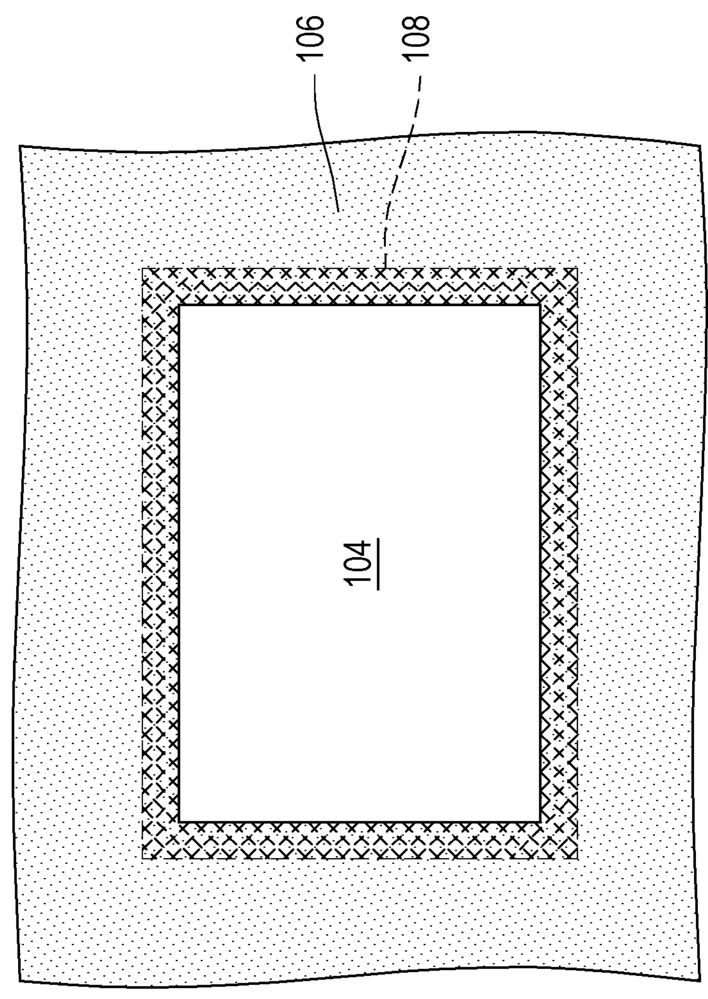
FIG. 1C is a schematic plan view illustrating one of the device dies and the surrounding gap profile modification pattern and dielectric material shown in FIG. 1A, according to some embodiments of the present disclosure.

FIG. 1C is a schematic plan view illustrating one of the device dies 104 and the surrounding gap profile modification pattern 108 and dielectric material 106, according to some embodiments of the present disclosure.

Referring to FIG. 1C, according to some embodiments, each device die 104 is laterally enclosed by one of the gap profile modification patterns 108. The gap profile modification pattern 108 may be respectively formed as a close ring extending along boundary of the surrounded device die 104. In addition, the gap profile modification patterns 108 are covered by the dielectric material 106, and thus depicted by ghost lines.

As described above, the gap profile modification patterns 108 are provided to re-define a topography on which the dielectric material 106 is formed. The re-defined topography has trenches with more rounded bottom corners, thus the dielectric material 106 can be filled in these trenches with less defects. As will be further described, after formation of the dielectric material 106, the package structure 100 may be subjected to further processes during processes for forming a complete semiconductor package.

Figure 2:
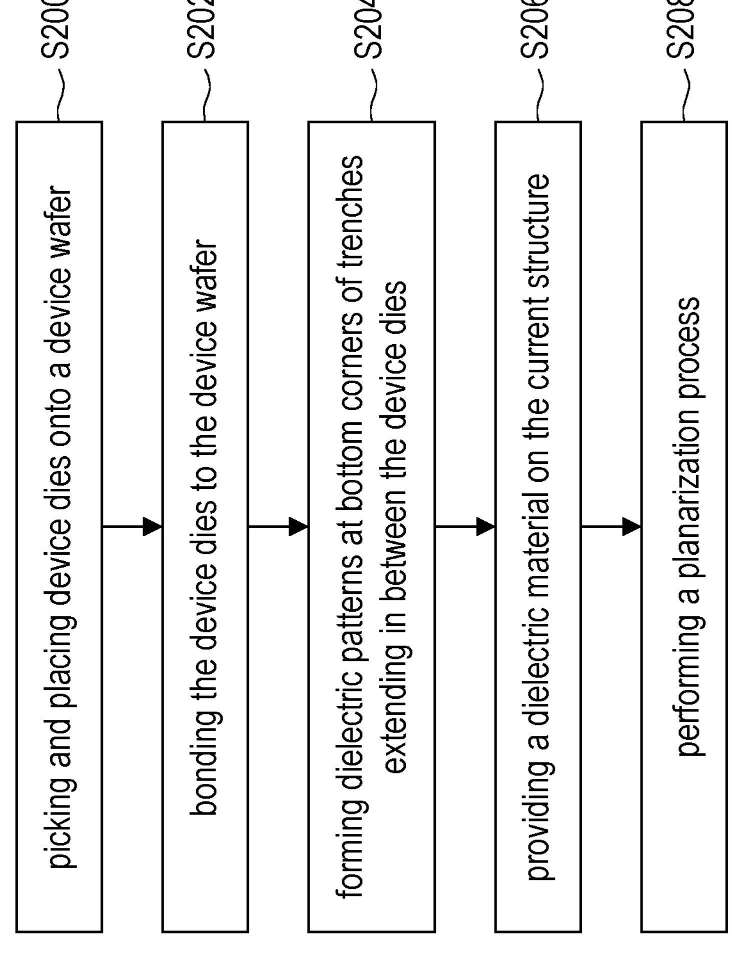
FIG. 2 is a flow diagram illustrating a process for forming the package structure as shown in FIG. 1A, according to some embodiments of the present disclosure.
Figure 3A:
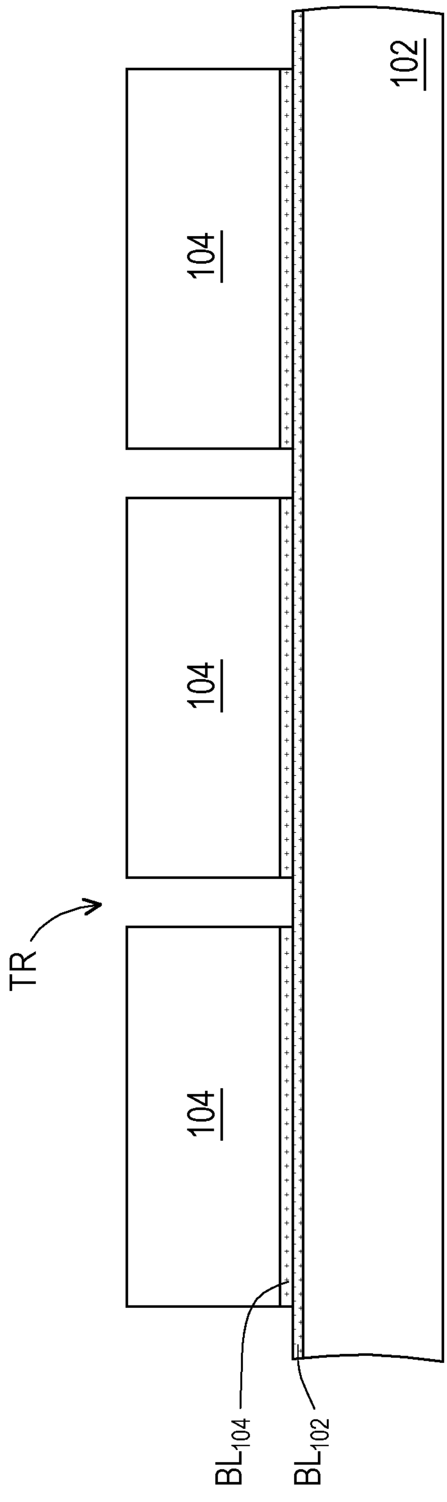
FIG. 3A through FIG. 3C are schematic cross-sectional views illustrating intermediate structures at various stages during the manufacturing process as shown in FIG. 2.
Figure 3B:
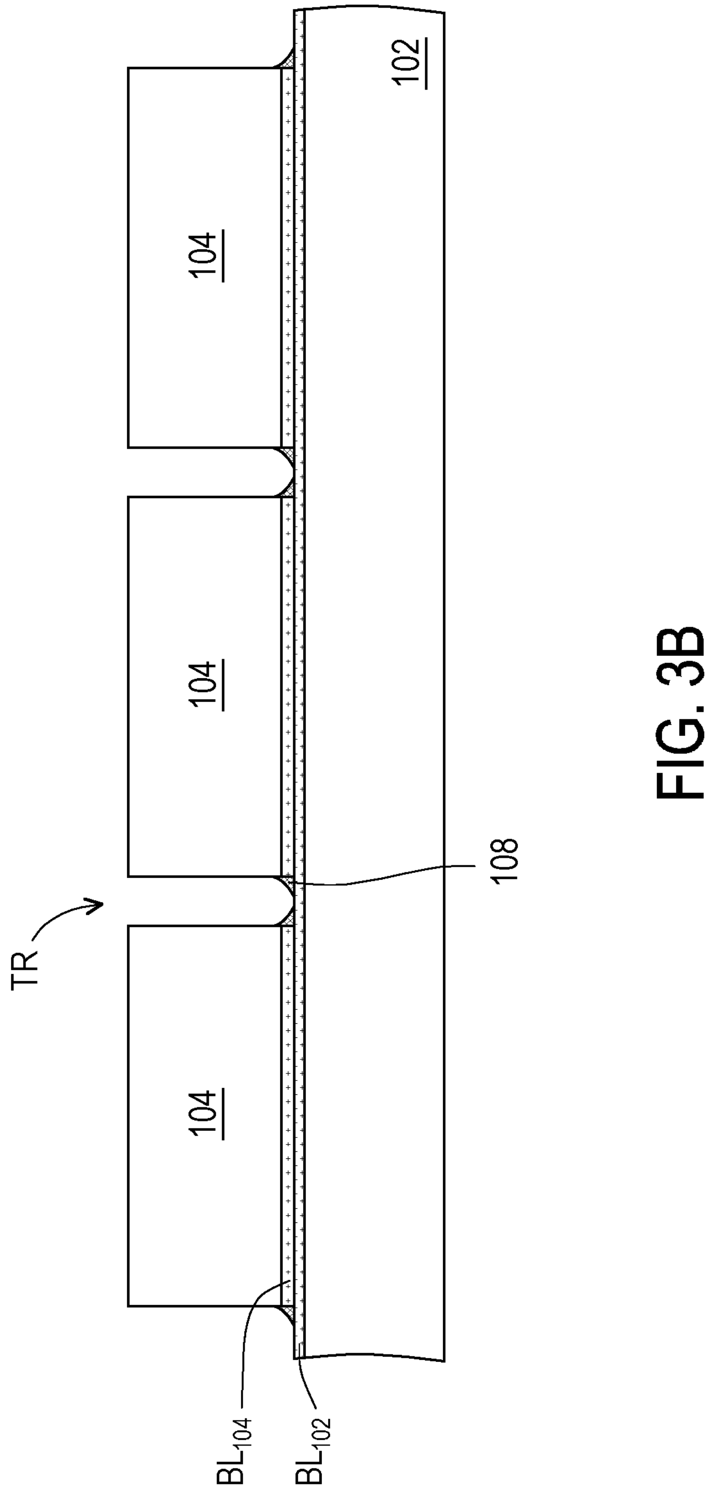
Figure 3C:
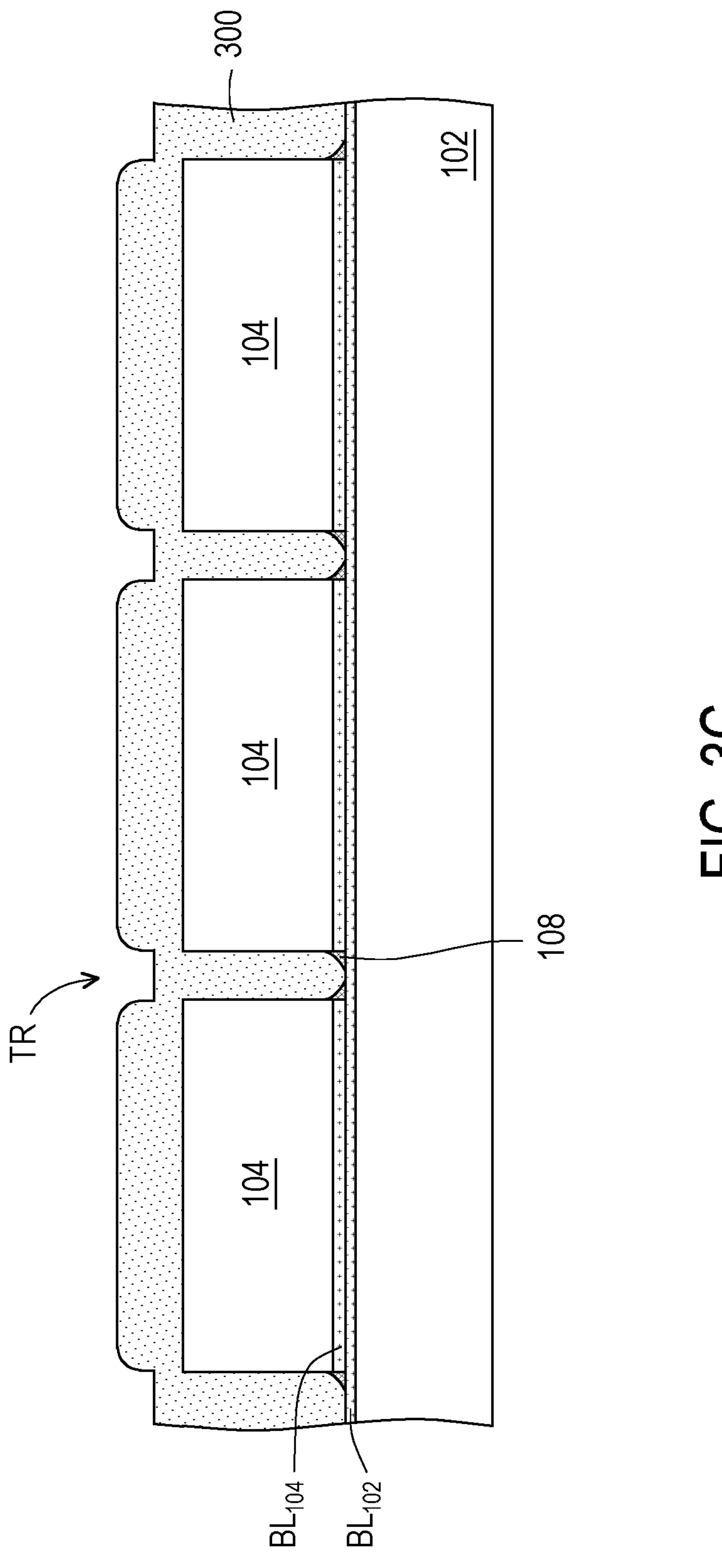

FIG. 2 is a flow diagram illustrating a process for forming the package structure 100, according to some embodiments of the present disclosure. FIG. 3A through FIG. 3C are schematic cross-sectional views illustrating intermediate structures at various stages during the manufacturing process as shown in FIG. 2.

Referring to FIG. 2 and FIG. 3A, step S200 is performed, and the device dies 104 are picked and placed onto the device wafer 102. The device dies 104 are separately placed on the device die 102, and trenches TR are defined between the device dies 104. The bonding layers $BL_{104}$ of the device dies 104 are in contact with the bonding layer $BL_{102}$ of the device wafer 102. As mentioned before, the bonding layers $BL_{104}$ can be located at the front sides or the back sides of the device dies 104. Similarly, the bonding layer $BL_{102}$ can be disposed at the front side or the back side of the device wafer 102.

Thereafter, step S202 is performed, and the device dies 104 are bonded to the device wafer 102. According to some embodiments, the device dies 104 are bonded to the device wafer 102 via a hybrid bonding process. In these embodiments, the conductive features in the bonding layers $BL_{104}$ are bonded to the conductive features in the bonding layer $BL_{102}$, and the insulating layers of the bonding layers $BL_{104}$ are bonded to the insulating layer of the bonding layer $BL_{102}$. A thermal treatment is involved for bonding the conductive features in the bonding layers $BL_{104}$ to the conductive features in the bonding layer $BL_{102}$, and another thermal treatment may be performed for bonding the insulating layers of the bonding layers $BL_{104}$ to the insulating layer of the bonding layer $BL_{102}$. A process temperature of the thermal treatment for bonding the insulating layers may be lower than a process temperature of the thermal treatment for bonding the insulating layers. In addition, the thermal treatment for bonding the insulating layers may precede the thermal treatment for bonding the conductive features. Alternatively, the thermal treatment for bonding the insulating layers may follow the thermal treatment for bonding the conductive features.

Referring to FIG. 2 and FIG. 3B, step S204 is performed, and the gap profile modification patterns 108 are formed in the trenches TR, to re-define the bottom corners of the trenches TR. According to some embodiments, the gap profile modification patterns 108 are formed by using a spin coating process. In these embodiments, the bonded structure as shown in FIG. 3A is spun at a pre-determined speed. Meanwhile, a solution including a spin-on-glass (SOG) material (e.g., a silicate based material, a siloxane based material or the like) distributed in a solvent is spread on the bonded structure. Subsequently, the coated structure is baked to drive off the solvent, and to densify the SOG material for forming the gap profile modification patterns 108. Alternatively, a polymer material (e.g., polyimide, PBO, BCB or the like) rather than the SOG material is spread on the bonded structure, and then the polymer material is cured by a thermal treatment to form the gap profile modification patterns 108. Particularly, the solution or the polymer is provided in very few amount, such that the coating can be limited to the bottom corners of the trenches TR, where the solution or the polymer is most likely to remain after the spinning. If more amount of the solution or the polymer is provided, bottom surfaces of the trenches TR might be entirely coated, and a layer extending along the bottom surfaces of the trenches TR might be resulted.

Referring to FIG. 3 and FIG. 3C, step S206 is performed, and a dielectric material 300 is provided on the current structure. The trenches TR with bottom corners re-defined by the gap profile modification patterns 108 are filled up by the dielectric material 300. Further, the top surfaces of the device dies 104 may be covered by the dielectric material 300. In some embodiments, the dielectric material 300 is formed of a silicon oxide based dielectric material (e.g., TEOS), and a method for forming the dielectric material 300 may include a CVD process. In these embodiments, a top surface of the dielectric material 300 may recess in regions overlapping the trenches TR. In alternative embodiments, the dielectric material 300 is formed of a molding compound, and a proper molding process may be used for forming the dielectric material 300.

Thereafter, step S208 is performed, and a planarization process is performed, and the package structure 100 as a resulting structure is shown in FIG. 1A. During the planarization process, portions of the dielectric material 300 above the top surfaces of the device dies 104 are removed, and remained portions of the dielectric material 300 form the dielectric material 106 as described with reference to FIG. 1A. According to some embodiments, the device dies 104 may be further thinned during the planarization process. As examples, the planarization process may include a polishing process, an etching process or a combination thereof.

Current structure as shown in FIG. 1A may be subjected to further packaging process(es). As an example, the current structure may be singulated.

Figure 4:
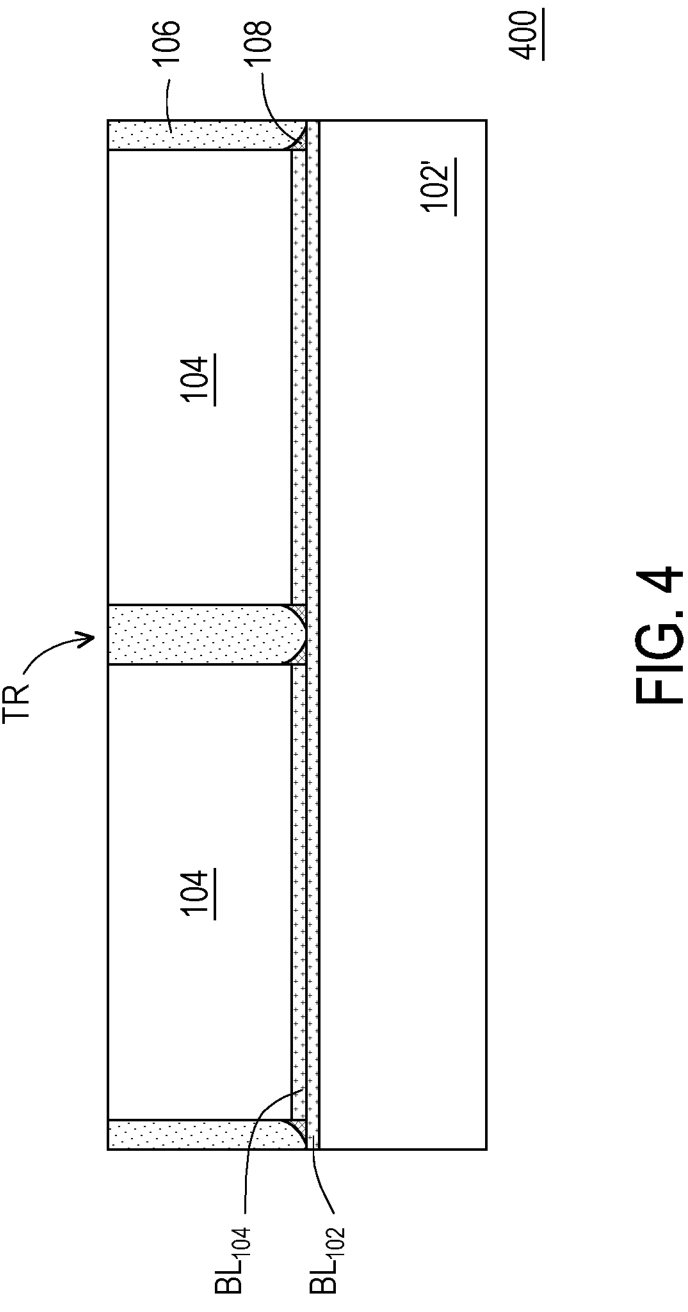
FIG. 4 is a schematic cross-sectional view illustrating a die stacking structure singulated from the package structure as shown in FIG. 1A, according to some embodiments of the present disclosure.

FIG. 4 is a schematic cross-sectional view illustrating a die stacking structure 400 singulated from the package structure 100, according to some embodiments of the present disclosure.

Referring to FIG. 4, the die stacking structure 400 is originated from the package structure 100 described with reference to FIG. 1A. A device die 102' in the die stacking structure 400 is singulated from the device wafer 102 of the package structure 100. In addition, the dielectric material 106 is cut along a sidewall of the device die 102' during the singulation, such that the singulated dielectric material 106 in the die stacking structure 400 may have a sidewall substantially coplanar with the sidewall of the device die 102'. Some of the device dies 104 arranged side-by-side and bonded to the device die 102' are laterally surrounded by the singulated dielectric material 106 and the gap profile modification patterns 108 covered by the singulated dielectric material 106.

Figure 5:
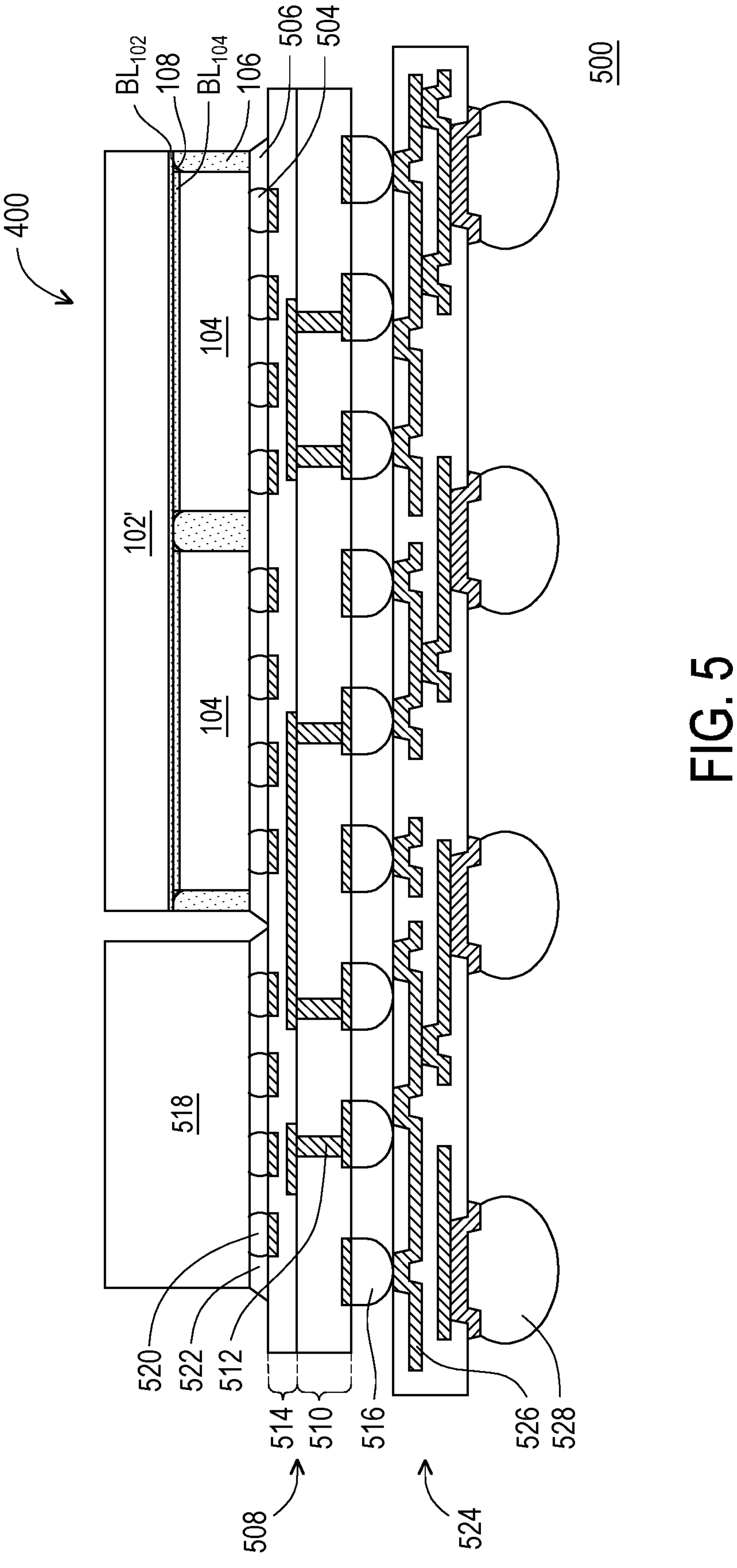
FIG. 5 is a schematic cross-sectional view illustrating a semiconductor package, according to some embodiments of the present disclosure.

FIG. 5 is a schematic cross-sectional view illustrating a semiconductor package 500, according to some embodiments of the present disclosure.

Referring to FIG. 5, the semiconductor package 500 includes the die stacking structure 400 as described with reference to FIG. 4, but may be flipped over. According to some embodiments, electrical connectors 504 are formed at a side of the die stacking structure 400 (e.g., a bottom side of the die stacking structure 400), and functioned as inputs/outputs (I/Os) of the device dies 102', 104 in the die stacking structure 400. As an example, the electrical connectors 504 are formed at a side of the device dies 104 and the dielectric material 106 facing away from the device die 102'. Further, a backside interconnection structure (not shown) for routing the device dies 104 to the electrical connectors 504 may be disposed in between the device dies 104 and the electrical connectors 504, and between the dielectric material 106 and the electrical connectors 504. In some embodiments, the electrical connectors 504 are micro-bumps. An optional underfill 506 may be formed to laterally surround the electrical connectors 504.

In some embodiments, the die stacking structure 400 is bonded to an interposer 508. The electrical connectors 504 may be used to establish contact between the die stacking structure 400 and the interposer 508. The interposer 508 may include a substrate 510 (e.g., a semiconductor substrate or an organic substrate) and through substrate vias 512 penetrating through the substrate 510. In addition, the interposer 508 may further include an interconnection structure 514 lying along a side of the substrate 510 facing toward the die stacking structure 400. The electrical connectors 504 can be routed to the other side of the substrate 510 through interconnection elements (e.g., conductive wirings and conductive vias) in the interconnection structure 514 and the through substrate vias 512 penetrating the substrate 510. Moreover, electrical connectors 516 may be formed at the side of the substrate 510 facing away from the die stacking structure 400, as interface to another package component. As an example, the electrical connectors 516 may be controlled collapse chip connection (C4) bumps.

In addition to the die stacking structure 400, other package components may also be bonded to the interposer 508. For instance, a memory die 518 is also bonded to the interposer 508, and arranged aside the die stacking structure 400. Electrical connectors 520 may be used for establishing contact between the memory die 518 and the interposer 508. As similar to the electrical connectors 504, the electrical connectors 520 may be micro-bumps. Optionally, the electrical connectors 520 may be laterally surrounded by an underfill 522.

Furthermore, the interposer 508 may be bonded onto a package substrate 524 via the electrical connectors 516. Interconnection elements 526 including conductive wirings and conductive vias may be formed in the package substrate 524, to establish routing paths between opposite sides of the package substrate 524. That is, the electrical connectors 516 at one side of the package substrate 524 can be routed to the other side of the package substrate 524 through these interconnection elements 526. In some embodiments, electrical connectors 528 as I/Os of the semiconductor package 500 are disposed at the side of the package substrate 524 facing away from the interposer 508, and are electrically connected to the interconnection elements 526 in the package substrate 524. As an example, the electrical connectors 528 may be ball grid array (BGA) balls.

Figure 6:
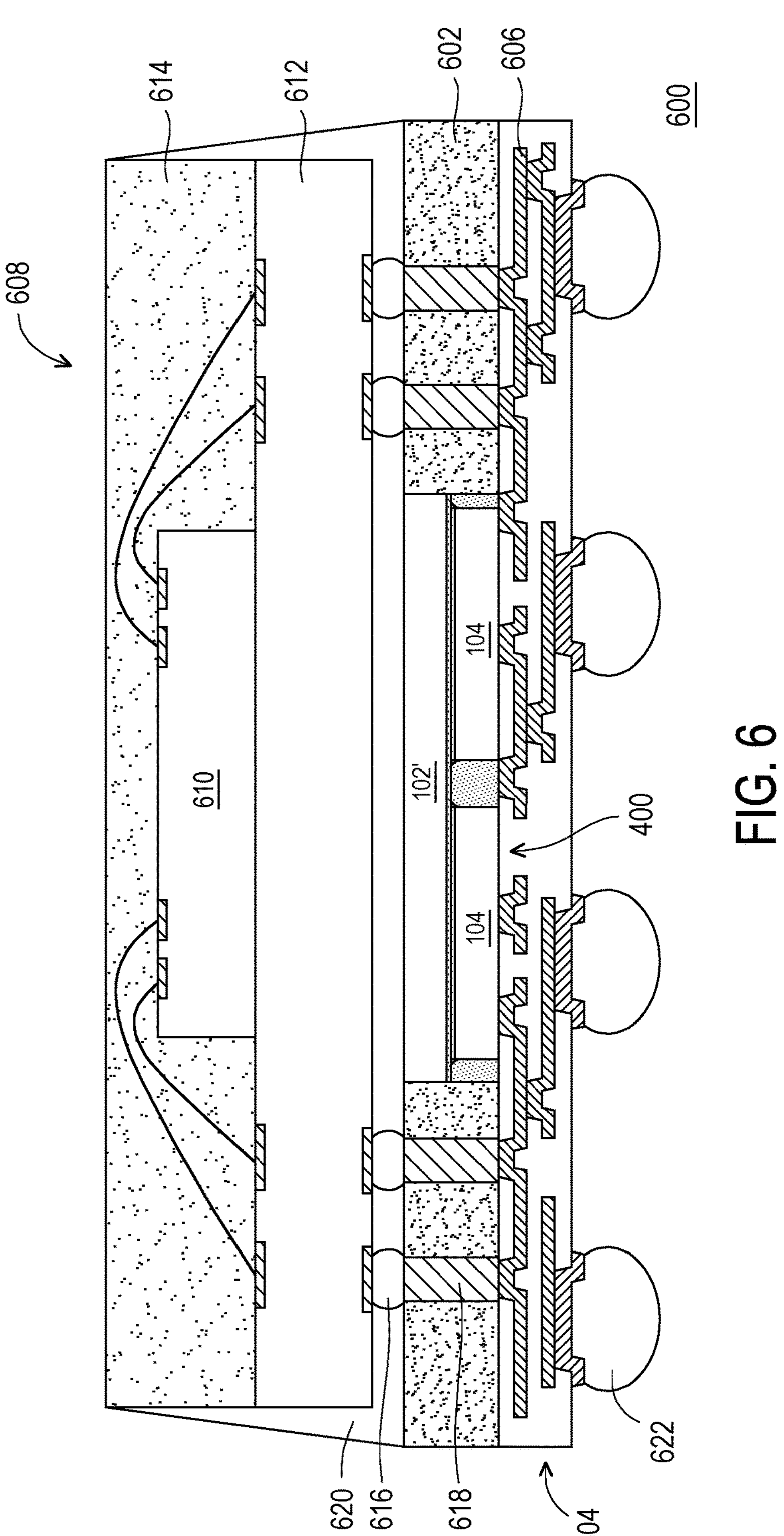
FIG. 6 is a schematic cross-sectional view illustrating a semiconductor package, according to some embodiments of the present disclosure.

FIG. 6 is a schematic cross-sectional view illustrating a semiconductor package 600, according to some embodiments of the present disclosure.

Referring to FIG. 6, as another example, the die stacking structure 400 singulated from the package structure 100 as shown in FIG. 1A can be applied to a semiconductor package 600. In the semiconductor package 600, the die stacking structure 400 is laterally encapsulated by an encapsulant 602, which may be formed of a molding compound. A redistribution structure 604 is formed at a bottom side of the die stacking structure 400, and also extends along a bottom side of the encapsulant 602. Redistribution elements 606 including conductive wirings and conductive vias are formed in the redistribution structure 604, and are configured to rout the die stacking structure 400 to another side of the redistribution structure 604 by a fan-out manner.

According to some embodiments, a semiconductor package 608 (e.g., memory package) is attached to a top side of the encapsulant 602. The semiconductor package 608 may include a semiconductor die 610 (e.g., a memory die) and a package substrate 612 lying below the semiconductor die 610. The semiconductor die 610 is bonded to the package substrate 612 (e.g., by a wire bonding manner), and may be laterally encapsulated by an encapsulant 614. Interconnection elements (not shown) formed in the package substrate 612 are configured to rout the semiconductor die 610 to a bottom side of the package substrate 612 facing toward the encapsulated die stacking structure 400. Further, electrical connectors 616 disposed at the bottom side of the substrate 612 may be used to establish contact between the semiconductor package 608 and the encapsulant 602. In these embodiments, through encapsulant vias 618 may be formed through the encapsulant 602 for connecting the electrical connectors 616 to the redistribution elements 606 in the redistribution structure 604. Therefore, the semiconductor package 608 can be routed to the bottom side of the redistribution structure 604 and/or interconnected with the die stacking structure 400 through the electrical connectors 616, the through encapsulant vias 618 and the redistribution elements 606 in the redistribution structure 604. In some embodiments, the electrical connectors 616 are laterally surrounded by an underfill 620. In addition, in some embodiments, electrical connectors 622 formed at the bottom side of the redistribution structure 604 are electrically connected to the redistribution elements 606 in the redistribution structure 604, and functioned as I/Os of the semiconductor package 600.

Figure 7:
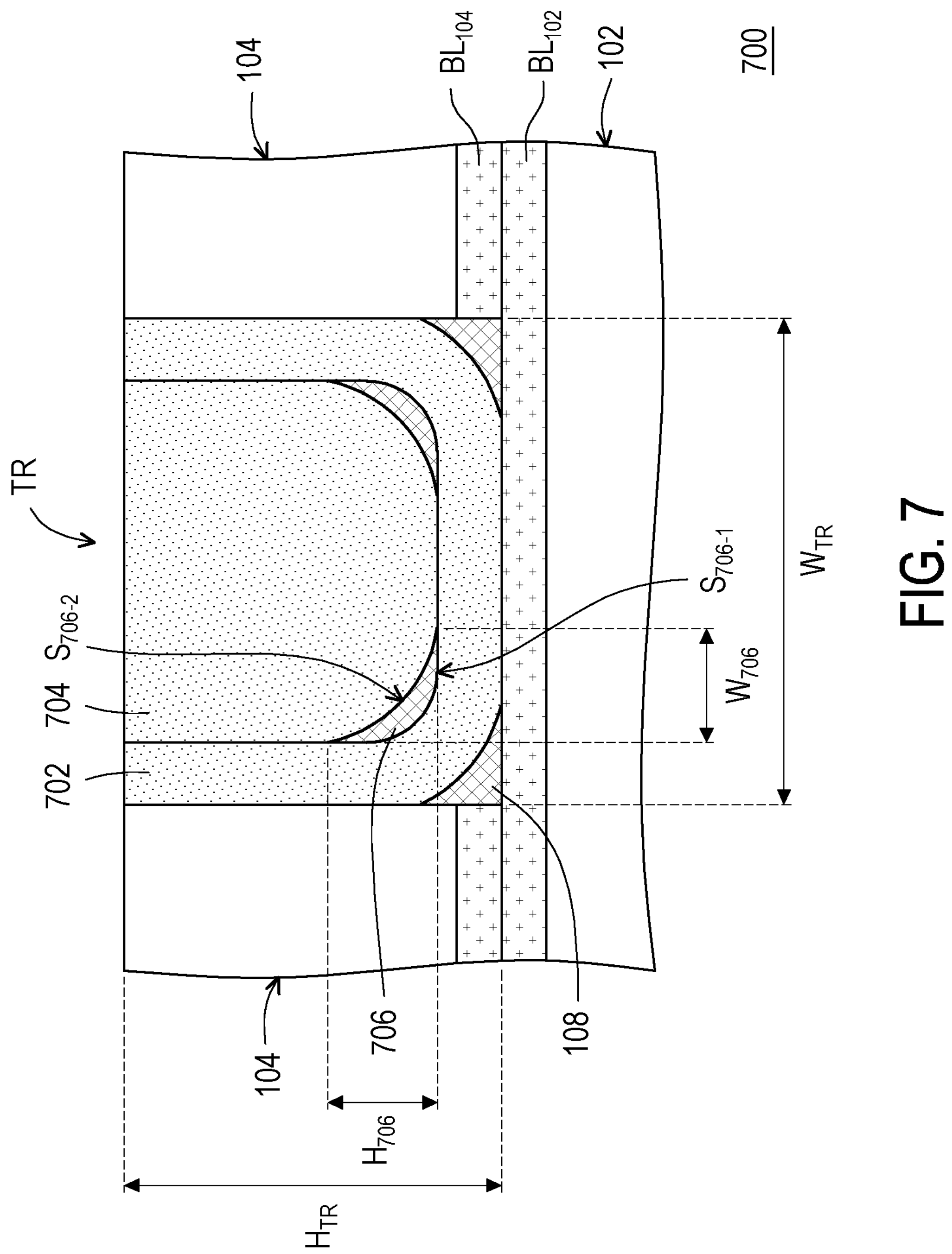
FIG. 7 is an enlarged schematic cross-sectional view illustrating a region between adjacent device dies in a package structure, according to some other embodiments of the present disclosure.

FIG. 7 is an enlarged schematic cross-sectional view illustrating a region between adjacent device dies 104 in a package structure 700, according to some other embodiments of the present disclosure.

The package structure 700 partially illustrated in FIG. 7 is similar to the package structure 100 as described with reference to FIG. 1A through FIG. 1C, except that the trenches TR between the device dies 104 in the package structure 700 are conformally lined by a conformal dielectric layer 702 and filled up by a dielectric material 704.

Before formation of the dielectric layer 702, bottom corners of the trenches TR are re-defined by the gap profile modification patterns 108, such that the dielectric layer 702 lining along sidewalls of the device dies 104, the concaved or slant surfaces of the gap profile modification patterns 108 and the top surface of the device wafer 102 may be formed with more promising quality, as similar to the effects described with reference to FIG. 1A and FIG. 1B. According to some embodiments, the dielectric layer 702 is formed of a silicon oxide based dielectric material. For instance, the silicon based dielectric material may include tetraethoxysilane (TEOS). In these embodiments, the dielectric layer 702 may be formed by a CVD process.

Due to the conformality of the dielectric layer 702, the dielectric layer 702 is recessed in corresponding to the trenches TR, and the dielectric material 704 fills up the recess. According to some embodiments, top ends of the dielectric layer 702 and the dielectric material 704 are substantially coplanar with top surfaces of the device dies 104. Before forming the dielectric material 704, bottom corners of the recess are re-defined by additional gap profile modification patterns 706. As a result, the recess to be filled by the dielectric material 704 can have more rounded bottom corners, and the dielectric material 704 can be formed with less defects, as similar to the dielectric material 106 described with reference to FIG. 1A and FIG. 1B. In some embodiments, the dielectric material 704 is formed of a silicon oxide based dielectric material (e.g., TEOS), and a method for forming the dielectric material 704 may include a CVD process. In alternative embodiments, the dielectric material 704 is formed of a molding compound, and a proper molding process is used for forming the dielectric material 704.

The gap profile modification patterns 706 are elevated from the gap profile modification patterns 108, and may partially overlap the gap profile modification patterns 108. As similar to the gap profile modification patterns 108, the gap profile modification patterns 706 may be laterally separated from one another, and may each laterally enclose one of the device dies 104. A surface $S_{706-1}$ of each gap profile modification pattern 706 extends along a concave surface of the dielectric layer 702. In addition, a concave or slant surface $S_{706-2}$ of each gap profile modification pattern 706 defines a re-defined bottom corner of the recess to be filled with the dielectric material 704, and is in contact with the dielectric material 704 after formation of the dielectric material 704. In some embodiments, the gap profile modification patterns 706 are formed of SOG or a polymer material (e.g., polyimide, PBO, BCB or the like), and a method for forming the gap profile modification patterns 706 may include a spin coating process and a following thermal treatment. In those embodiments where the height $H_{TR}$ of the trenches TR ranges from about 10 μm to about 100 μm, a height $H_{706}$ of the gap profile modification patterns 706 may range from about 1 μm to about 10 μm. Further, in those embodiments where the width $W_{TR}$ of the trenches TR ranges from about 10 μm to about 100 μm, a width $W_{706}$ of the gap profile modification patterns 706 may range from about 1 μm to about 10 μm.

In regarding manufacturing procedure of the package structure 700, a dielectric material layer to be patterned for forming the dielectric layer 702 is conformally formed along exposed surfaces of the device dies 104, the gap profile modification patterns 108 and the device wafer 102, after forming the gap profile modification patterns 108 around the device dies 104 bonded to the device wafer 102. Thereafter, the gap profile modification patterns 706 are formed at the bottom corners of the recess defined by the concave surface of the dielectric material layer. A method for forming the gap profile modification patterns 706 is similar to the method described with reference to FIG. 3A. Subsequently, the recess may be filled up by a dielectric material, and the dielectric material may further span over the top surfaces of the device dies 104. Then, a planarization process may be performed to remove portions of the dielectric material layer and the dielectric material above the top surfaces of the device dies 104. Portions of the dielectric material remained in the trenches TR form the dielectric layer 702, and portions of the dielectric material remained in the trenches TR form the dielectric material 704. As examples, the planarization process may include a polishing process, an etching process or a combination thereof.

In alternative embodiments, more tiers of the gap modification patterns can be formed in the trenches TR. For instance, another conformal dielectric layer is formed in the trenches TR after formation of the gap profile modification patterns 704, and another tier of gap profile modification patterns are formed at bottom corners of the recess defined by this conformal dielectric layer. Subsequently, a dielectric material is provided to fill up the recess.

Figure 8A:
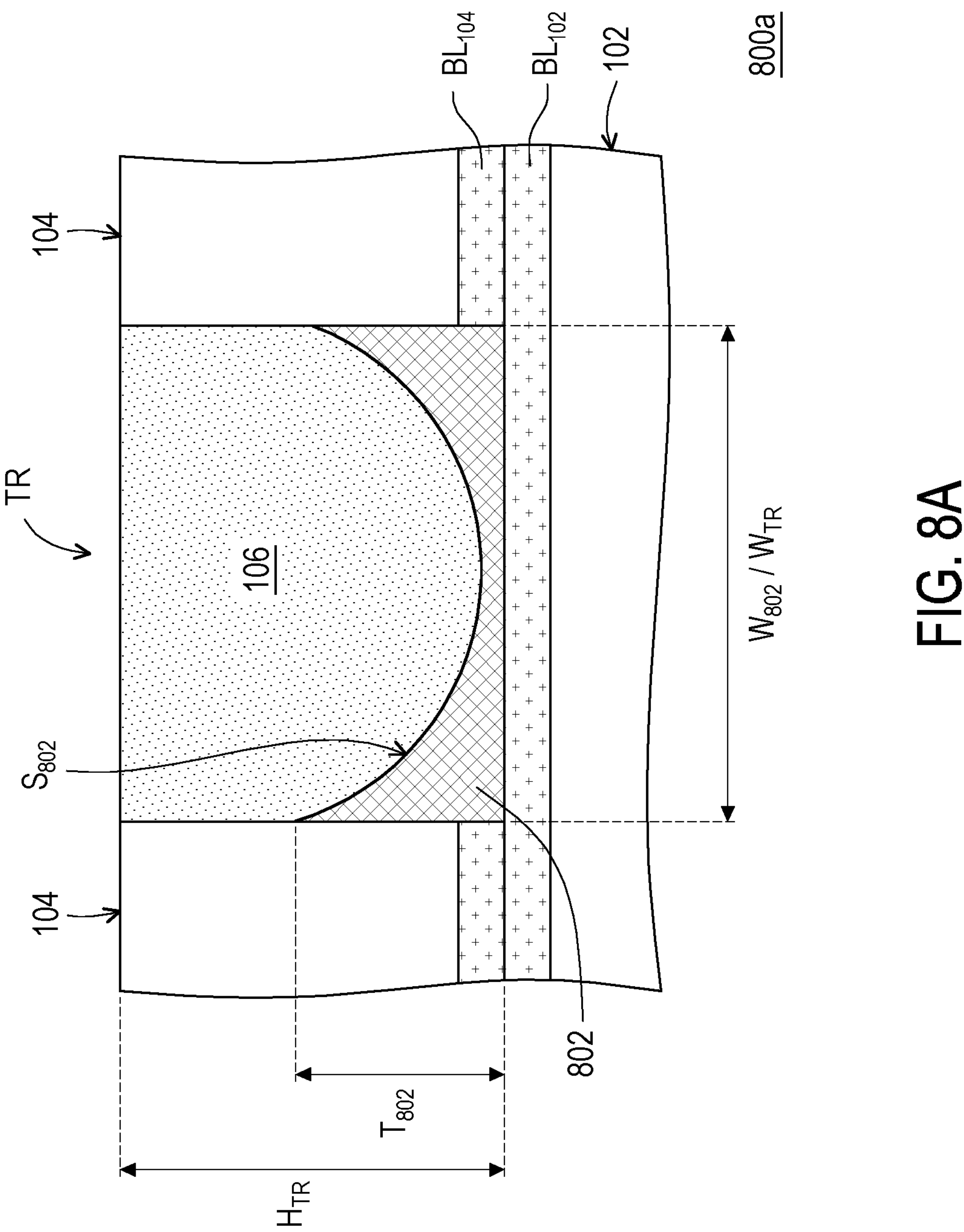
FIG. 8A is an enlarged schematic cross-sectional view illustrating a region between adjacent device dies in a package structure, according to some other embodiments of the present disclosure.

FIG. 8A is an enlarged schematic cross-sectional view illustrating a region between adjacent device dies 104 in a package structure 800*a*, according to some other embodiments of the present disclosure.

Referring to FIG. 8A, the package structure 800*a* partially illustrated in FIG. 7 is similar to the package structure 100 as described with reference to FIG. 1A through FIG. 1C, except that the package structure 800*a* includes a gap profile modification layer 802 rather than the gap profile modification patterns 108.

The gap profile modification layer 802 extends along bottom surfaces of the trenches TR, and laterally surrounds each of the device dies 104. In some embodiments, portions of the device wafer 102 between the device dies 104 are entirely covered by the gap profile modification layer 802. In these embodiments, the dielectric material 106 formed on the gap profile modification layer 802 is vertically separated from the device wafer 102 through the gap profile modification layer 802, and a width $W_{802}$ of the gap profile modification layer 802 is substantially equal with the width $W_{TR}$ of the trenches TR. Further, a thickness $T_{802}$ of the gap profile modification layer 802 may gradually decrease toward central regions of the trenches TR from sidewalls of the device dies 104. As a result, the gap profile modification layer 802 may have a concave top surface $S_{802}$, and the trenches TR are re-defined by the gap profile modification layer 802 to have more rounded bottom corners. Therefore, the dielectric material 106 filling up the re-defined trenches TR can be formed with less defects. In some embodiments, a topmost end of the gap profile modification layer 802 is lower than the top surfaces of the device dies 104, and a maximum value of the thickness $T_{802}$ is less than the height $H_{TR}$ of the trenches TR. For instance, the thickness $T_{802}$ may range from about 2 μm to about 10 μm when the height $H_{TR}$ ranges from about 10 μm to about 100 μm, and a maximum value of the thickness $T_{802}$ is about 0.05 to about 0.5 of the height $H_{TR}$.

According to some embodiments, the gap profile modification layer 802 is also formed of SOG or a polymer material (e.g., polyimide, PBO, BCB or the like). As a difference from the method for forming the gap profile modification patterns 108 as described with reference to FIG. 3B, a method for forming the gap profile modification layer 802 may include an inkjet printing process, and may include a following thermal treatment.

Figure 8B:
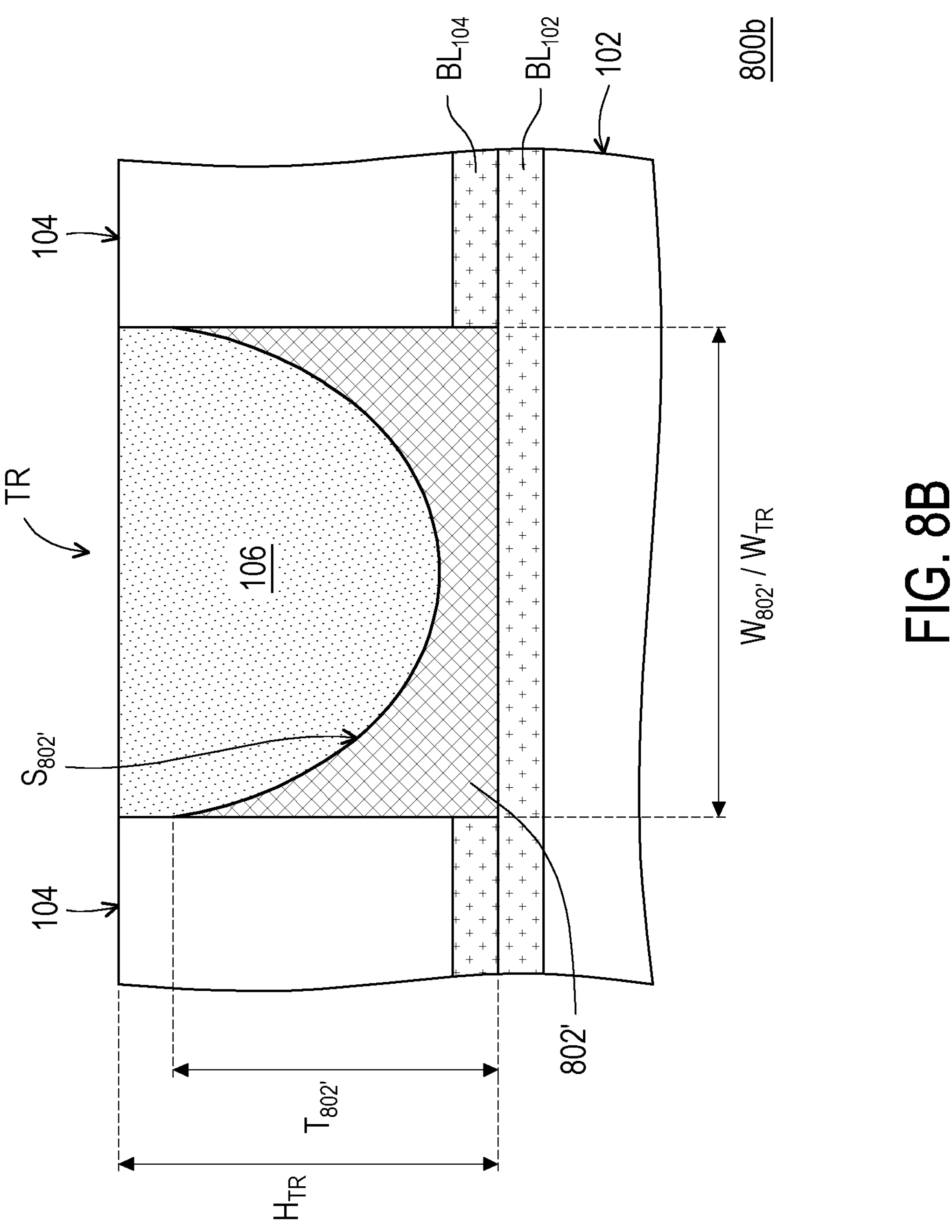
FIG. 8B is an enlarged schematic cross-sectional view illustrating a region between adjacent device dies in a package structure, according to some other embodiments of the present disclosure.

FIG. 8B is an enlarged schematic cross-sectional view illustrating a region between adjacent device dies 104 in a package structure 800*b*, according to some other embodiments of the present disclosure.

Referring to FIG. 8B, the package structure 800*b* is similar to the package structure 800*a* as described with reference to FIG. 8A, that also uses a gap profile modification layer (referred to as a gap profile modification layer 802' herein) lining along entire bottom surface of the dielectric material 106 as well. In other words, a width $W_{802'}$ of the gap profile modification layer 802' is substantially equal to the width $W_{TR}$ of the trenches TR as well. Further, a thickness $T_{802'}$ of the gap profile modification layer 802' also gradually decreases from the sidewalls of the device dies 104 to central regions of the trenches TR, such that the gap profile modification layer 802' also has a concave surface $S_{802'}$ lining along the bottom surface of the dielectric material 106.

As a difference from the gap profile modification layer 802 in the package structure 800*a* described with reference to FIG. 8A, the thickness $T_{802'}$ of the gap profile modification layer 802' is greater than the thickness $T_{802}$ of the gap profile modification layer 802 as described with reference to FIG. 8A. In some embodiments where the height $H_{TR}$ of the trenches TR ranges from about 10 μm to about 100 μm, the thickness $T_{802'}$ of the gap profile modification layer 802' may range from about 8 μm to about 80 μm, and a ratio of a maximum value of the thickness $T_{802'}$ over the height $H_{TR}$ may range from about 0.5 to about 1.

The gap profile modification layer 802' is also formed of SOG or a polymer material (e.g., polyimide, PBO, BCB or the like). As a difference from the method for forming the gap profile modification layer 802 as described with reference to FIG. 8A, a method for forming the gap profile modification layer 802' may include a dispensing process, and may include a following thermal treatment.

It should be noted that, although the embodiments shown in FIG. 7, FIG. 8A and FIG. 8B are described separately, these embodiments may be combined. For instance, the gap profile modification patterns 108 as shown in FIG. 7 can be alternatively replaced by the gap profile modification layer 802 as shown in FI. 7A or the gap profile modification layer 802' as shown in FIG. 8B. Similarly, the gap profile modification patterns 706 as shown in FIG. 7 can be alternatively replaced by the gap profile modification layer 802 as shown in FIG. 8A or the gap profile modification layer 802' as shown in FIG. 8B as well.

Furthermore, the package structures 700, 800*a*, 800*b*, combinations of the package structures 700, 800*a* and combinations of the package structures 700, 800*b* described above can be respectively singulated to form a die stacking structure similar to the die stacking structure 400 described with reference to FIG. 5. In these die stacking structures, the device wafer 102 is singulated to form the device die 102'. In addition, the die stacking structures can each be used in various semiconductor packages (e.g., the semiconductor packages 500, 600 as described with reference to FIG. 5 and FIG. 6) as well.

As above, a solution for improving quality of a dielectric material used for laterally encapsulating separate device dies is provided. Before filling the dielectric material into trenches extending in between the device dies, one or more tires of gap profile modifier (e.g., each tier includes laterally separated gap profile modification patterns or a gap profile modification layer) is provided in bottom portions of the trenches, and bottom surfaces of the trenches are re-defined to have rounded bottom corners. As a result, the dielectric material filled into the re-defined trenches may have less defects, thus the device dies can be better protected by the dielectric material from possible moisture absorption, corrosion, electrical noise or the like.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an aspect of the present disclosure, a die stacking structure is provided. The die stacking structure comprises:

a first device die; second device dies, bonded onto the first device die, and arranged side-by-side; a gap profile modifier, laterally enclosing bottommost portions of the second device dies, wherein a thickness of the gap profile modifier gradually decreases away from sidewalls of the second device dies; and a dielectric material, covering the gap profile modifier and laterally surrounding the second device dies.

In another aspect of the present disclosure, a die stacking structure is provided. The die stacking structure comprises: a first device die; second device dies, bonded onto the first device die, and laterally separated from one another; separate first gap profile modification patterns, laterally enclosing bottommost portions of the second device dies, and having slant or concave surfaces extending from sidewalls of the second device dies to a top surface of the first device die; and a dielectric layer, conformally extending along sidewalls of the second device dies, the slant or concave surfaces of the first gap modification patterns and the top surface of the first device die.

In yet another aspect of the present disclosure, a semiconductor package is provided. The semiconductor package comprises a die stacking structure and a package component electrically connected to the die stacking structure from above or below the die stacking structure. The die stacking structure comprises: a first device die; second device dies, bonded to the first device die and arranged side-by-side; gap profile modifier, laterally enclosing portions of the second device dies closest to the first device die, wherein a thickness of the gap profile modifier gradually decreases away from sidewalls of the second device dies; and a dielectric material, covering the gap profile modifier and laterally surrounding the second device dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A die stacking structure, comprising:
- a first device die;
- second device dies, bonded onto the first device die, and arranged side-by-side;
- a gap profile modifier, laterally enclosing bottommost portions of the second device dies, wherein a thickness of the gap profile modifier gradually decreases away from sidewalls of the second device dies;
- a dielectric layer conformally extending along sidewalls of the second device dies, and a slant or concave surface of the gap profile modifier; and
- a dielectric material, disposed on the dielectric layer, covering the gap profile modifier and laterally surrounding the second device dies.

2. The die stacking structure according to claim 1, wherein the slant or concave surface of the gap profile modifier lines along a bottom surface of the dielectric material.

3. The die stacking structure according to claim 1, wherein a topmost end of the gap profile modifier is lower than top surfaces of the second device dies.

4. The die stacking structure according to claim 1, wherein the gap profile modifier comprises separate gap profile modification patterns each laterally enclosing the bottommost portion of one of the second device dies.

5. The die stacking structure according to claim 4, wherein the slant or concave surface of each of the gap profile modification patterns extends from the sidewall of the surrounded second device die to a top surface of the first device die.

6. The die stacking structure according to claim 1, wherein the gap profile modifier comprises a gap profile modification layer laterally enclosing the bottommost portions of the second device dies.

7. The die stacking structure according to claim 6, wherein the dielectric material is spaced apart from the first device die along a vertical direction via the gap profile modification layer.

8. The die stacking structure according to claim 6, wherein the slant or concave surface of the gap profile modification layer extends along a bottom surface of the dielectric material.

9. The die stacking structure according to claim 1, wherein the gap profile modifier is formed of spin-on-glass (SOG), and the dielectric material is a silicon oxide based dielectric material.

10. The die stacking structure according to claim 1, wherein a sidewall of the dielectric material is substantially coplanar with a sidewall of the first device die.

11. The die stacking structure according to claim 1, the first device die and the second device dies respectively have a bonding layer and the first device die is bonded to the second device dies by a hybrid bonding manner.

12. A die stacking structure, comprising:
- a first device die;
- second device dies, bonded onto the first device die, and laterally separated from one another;
- separate first gap profile modification patterns, laterally enclosing bottommost portions of the second device dies, and having slant or concave surfaces extending from sidewalls of the second device dies to a top surface of the first device die; and
- a dielectric layer, conformally extending along sidewalls of the second device dies, the slant or concave surfaces of the first gap modification patterns and the top surface of the first device die.

13. The die stacking structure according to claim 12, further comprising:
- separate second gap profile modification patterns, positioned at bottom corners of a recess defined by the dielectric layer, and respectively have a slant or concave surface extending from a sidewall of the recess to a bottom surface of the recess.

14. The die stacking structure according to claim 13, further comprising:
- a dielectric material, covering the slant or concave surfaces of the second gap profile modification patterns and filling up the recess.

15. A semiconductor package, comprising:
- a die stacking structure, comprising:
  - a first device die;
  - second device dies, bonded to the first device die and arranged side-by-side;
  - gap profile modifier, laterally enclosing portions of the second device dies closest to the first device die, wherein a thickness of the gap profile modifier gradually decreases away from sidewalls of the second device dies, and the gap profile modifier has a bottom surface laterally extending along the first device die, a slant or concave surface, and a sidewall vertically extending along the sidewalls of the second device dies, and abutting the bottom surface of the gap profile modifier;

a dielectric material, covering the gap profile modifier and laterally surrounding the second device dies; and a dielectric layer, separating the dielectric material from the gap profile modifier, the first device die and the second device dies, and conformally extending along sidewalls of the second device dies, and the slant or concave surface of the gap profile modifier; and a package component, electrically connected to the die stacking structure from above or below the die stacking structure.

16. The semiconductor package according to claim 15, wherein the package component is an interposer comprising through substrate vias for providing vertical conduction paths, and the die stacking structure is bonded to a first side of the interposer.

17. The semiconductor package according to claim 16, wherein the interposer is bonded to a package substrate by a second side facing away from the first side.

18. The semiconductor package according to claim 15, wherein the die stacking structure is laterally encapsulated by an encapsulant, and a redistribution structure is formed along a first side of an encapsulated structure comprising the die stacking structure and the encapsulant.

19. The semiconductor package according to claim 18, further comprising a semiconductor package bonded to a second side of the encapsulated structure facing away from the redistribution structure, wherein through encapsulant vias extend through the encapsulant to provide vertical conductive paths in the encapsulant.

20. The semiconductor package according to claim 15, wherein a top surface of the dielectric layer is between a top surface of the dielectric material and top surfaces of the second device dies.

* * * * *